United States Patent [19]
Lo et al.

[11] Patent Number: 5,775,567
[45] Date of Patent: Jul. 7, 1998

[54] APPARATUS FOR WIREBONDING USING A TUBULAR PIEZOELECTRIC ULTRASONIC TRANSDUCER

[75] Inventors: Jiann-Chang Lo; Michael Servedio, both of Boca Raton, Fla.

[73] Assignee: International Business Machines Corporation, Armonk, N.Y.

[21] Appl. No.: 616,128

[22] Filed: Mar. 14, 1996

[51] Int. Cl.⁶ ............................................. B23K 20/10
[52] U.S. Cl. ............................... 228/1.1; 228/180.5
[58] Field of Search ............................ 228/101, 102, 228/180.5

[56] References Cited

U.S. PATENT DOCUMENTS

| | | | |
|---|---|---|---|
| 3,357,090 | 12/1967 | Tiffany | 29/470 |
| 3,384,283 | 5/1968 | Mims | 228/1 |
| 3,401,861 | 9/1968 | Folk | 228/1 |
| 4,437,604 | 3/1984 | Razon et al. | 228/179 |
| 4,877,173 | 10/1989 | Fujimoto et al. | 228/1.1 |
| 5,201,453 | 4/1993 | Amador et al. | 228/110 |
| 5,263,630 | 11/1993 | Kanomata et al. | 228/1.1 |

*Primary Examiner*—Kenneth J. Ramsey
*Attorney, Agent, or Firm*—Richard A. Tomlin; Ronald V. Davidge

[57] ABSTRACT

In ultrasonic wirebonding apparatus, vibrations produced using a tubular piezoelectric (piezoceramic) actuator, driven by electrical current at an ultrasonic frequency, are used to provide energy for the wirebonding process. An assembly including means for mounting the actuator at a proximal end, the actuator itself, and a bonding tip extending from a distal end of the actuator, are moved by a carrier between the various points at which wirebonding is to occur. The bonding wire is fed through a passageway in this assembly. The carrier slides on a first carriage for movement into engagement with the workpiece. The first carriage slides in a first direction on a second carriage, which in turn slides in a second direction, to move between points at which wirebonding is to occur. The workpieces, such as circuit chips being manufactured, are moved into a workspace for wirebonding, are held therein during processing, and are subsequently removed from the workspace.

19 Claims, 6 Drawing Sheets

APPARATUS FOR WIREBONDING USING A TUBULAR PIEZOELECTRIC ULTRASONIC TRANSDUCER

CROSS-REFERENCE TO A RELATED APPLICATION

This application is related by common inventorship and subject matter to a application filed on Mar. 14, 1996, entitled "LINKAGE DRIVE MECHANISM FOR ULTRASONIC WIREBONDING," which has issued as U.S. Pat. No. 5,626,276, and which is entirely incorporated herein by this reference.

BACKGROUND OF THE INVENTION

1. Field of the Invention

This invention relates to the production of integrated circuits, and, more particularly, to an apparatus for ultrasonically bonding external leads of a semiconductor integrated circuit to electrodes of the integrated circuit.

2. Background Information

Wirebonding is the most common technology used in the electronic packaging industry for making electrical connections between the electrode pads on an integrated circuit chip pellet and wires extending to a substrate providing external connections to the chip. Wirebonding is typically performed using ultrasonic bonding, thermocompression bonding, or thermosonic bonding. While ultrasonic wedge wirebonding is slower and more expensive than the other types, it currently becomes more popular because it can be performed at a lower temperature.

In ultrasonic wirebonding, the wire is typically fed through a hole extending through a bonding tip. The hold may extend centrally and axially downward through the tip, or it may extend at an oblique angle from an opening at a side of the tip to an opening in the distal surface of the tip. With conventional apparatus, ultrasonic vibrations are introduced into a proximal end of the bonding tip by means of an ultrasonic transducer through an ultrasonic horn. During the bonding process, the wire, extending from the distal end of the bonding tip, is pressed between the distal end of the bonding tip and the electrode of the circuit chip pellet. Thus, the bonding tip transmits ultrasonic vibrations between the ultrasonic horn and the wire, holds the wire in place, and presses the wire against the electrode, as required in the bonding process. With the wire firmly held in place, vibrations are applied at a typical frequency of 60 KHz with an amplitude of 2.5 microns.

In conventional ultrasonic wirebonding apparatus, vibrations are derived from the operation of a magnetostrictive transducer including a laminated metallic core composed of a magnetostrictive material, such as nickel, an excitation coil, to which an alternating frequency current is applied to produce the vibrations, and a polarizing coil, to which a direct current is applied. These vibrations are fed through an ultrasonic horn or coupling to the bonding tip, at which vibrations are transmitted to the wire being bonded. While such a transducer is readily able to produce the type of vibrations needed for wirebonding, it is necessarily large in size and mass.

Alternatively, the vibrations needed for wirebonding are conventionally produced using a stacked rectangular piezoelectric transducer. While such a transducer is much lighter and more compact than a magnetostrictive transducer, the conventional devices associated with moving the transducer from one location to another on a circuit chip limit the speed at which such motions occur. What is needed is a combination of an ultrasonic transducer which is small and light, and which has a center of gravity physically near the point at which bonding occurs, and a drive means which is also light and capable of rapid response.

Between wirebonding operations on an individual chip, either the wirebonding apparatus or the chip must be moved by a servomechanism, in order to traverse between the points at which wirebonding is to occur, and in order to bring the bonding tip into contact for the bonding process and out of contact for movement to the next point. If the wirebonding apparatus is to be moved, the wire, the bonding tip, and the ultrasonic transducer must be moved together, creating a significant mass which severely limits the speed at which the apparatus can be moved. This configuration physically separates the center of mass of the transducer from the distal end of the bonding tip, which must be accurately located at each bonding site, increasing the complexity of the dynamics associated with movement of the bonding tip. While the circuit chip being carried through the wirebonding process is much lighter than the wirebonding apparatus, moving the chip to traverse between wirebonding points while the wirebonding apparatus is held stationary places further burdens on the manufacturing process, since each chip must be loaded in a fixture to be moved separately, chips cannot be processed in a batch or as a part of a continuous flow.

Piezoelectric (piezoceramic) tube actuators have been used in a number of applications requiring the precise control of very small motions, such as the micropositioning for scanning tunneling microscopy.

What is needed is a wirebonding system in which circuit chips may be handled by means of a batch or continuous process, with the required movements among points for wirebonding being handled by moving the wirebonding apparatus, as the circuit chip is held still. Such a system needs a very light, and hence easily movable method for generating ultrasonic vibrations. It is also very desirable that the transducer producing the vibrations is located physically close to the distal end of the bonding tip, which must be accurately moved.

DESCRIPTION OF THE PRIOR ART

U.S. Pat. Nos. 3,357,090 to Tiffany and 4,877,173 to Fujimoto, et al., describe ultrasonic welding equipment including a bonding tip having an axial hole extending therethrough, through which a wire is fed for attachment to the surface of a semiconductor element, and a magnetostrictive transducer attached to a coupling member extending laterally from a side of the bonding tip. In such apparatus, the bonding tip is moved laterally, essentially parallel to the work surface to which the wire is attached, at an ultrasonic frequency, such as 60 KHz. The apparatus of Tiffany is particularly adapted for the attachment of a gold ball as well as for the attachment of a wire, with a cavity in the end of bonding tip being adapted to carry and position the ball. In the apparatus of Fujimoto, et al., the ultrasonic transducer and the bonding tip are coupled by an ultrasonic horn formed of a metallic material having a thermal coefficient of expansion of no more than about 0.000005 per degree C. to limit locational errors due to thermal expansion. Both Tiffany and Fujimoto teach moving the semiconductor element on which bonding is being performed to traverse between positions in which bonding is to occur, and moving the bonding tip into and out of engagement.

U.S. Pat. Nos. 3,384,283 to Mims and 5,201,453 to Amador, et al., describe ultrasonic welding apparatus which produces vibrations within the bonding tip substantially perpendicular to the surface of the workpiece to which a wire is to be welded. The bonding tip includes an axial hole through which the wire is fed for bonding. The vibratory transistor is coupled to the bonding tip directly, or through a bifurcated coupling member, or "tuning fork," having the bonding tip and transducer attached to opposite tines, as shown particularly by Mims. The wire may be fed through a hole extending axially through a mounting plate, an ultrasonic transducer, a transducer mount, and the bonding tip, with the ultrasonic transducer and the bonding tip being coaxially aligned, as particularly shown by Amador, et al. Mims teaches the movement of the workpiece to traverse between the positions in which bonding operations are to occur, while Amador, et al., teach movement of the bonding apparatus for this purpose.

U.S. Pat. No. 4,434,604 to Razon et al. describes a method for making ultrasonic fine wire connections, using a capillary wedge bonding tool with an annular working face. The wire is fed through an axial hole in the bonding tip of an ultrasonic wirebonding tool. When the second bond is made, with a wire extending from a first bond to form an interconnection, the bonding tool is moved away from the second bond to leave a small portion of the wire exposed out of the bonding tool. The wire is clamped, and the bonding tool is moved away from the second bond to break the wire and to form a wire bonding tail. Movement of the bonding apparatus is used to traverse between the positions in which bonding operations are to occur.

While the patents described above teach either moving the workpiece or the bonding apparatus to traverse between bonding positions, the great size and mass of conventional ultrasonic transducers is not addressed. Again, what is needed is a light and compact mechanism for producing ultrasonic vibrations, which can be quickly moved between bonding points in a bonding apparatus.

SUMMARY OF THE INVENTION

In accordance with one aspect of the invention, there is provided apparatus for performing wirebonding operations on a circuit chip, with the apparatus including a tubular piezoelectric actuator, a mechanism for mounting the actuator at its near end to extend in an engagement direction, a bonding tip attached to a far end of the actuator, extending from the actuator in the engagement direction, a passageway, and an actuator drive mechanism. The passageway is formed by internal surfaces of the mechanism for mounting the actuator, of the actuator, and of the bonding tip, extending through these parts for supplying bonding wire. The actuator drive mechanism applies an electrical signal at an ultrasonic frequency, causing the far end of the actuator to vibrate at the ultrasonic frequency.

DETAILED DESCRIPTION

Figure 1:
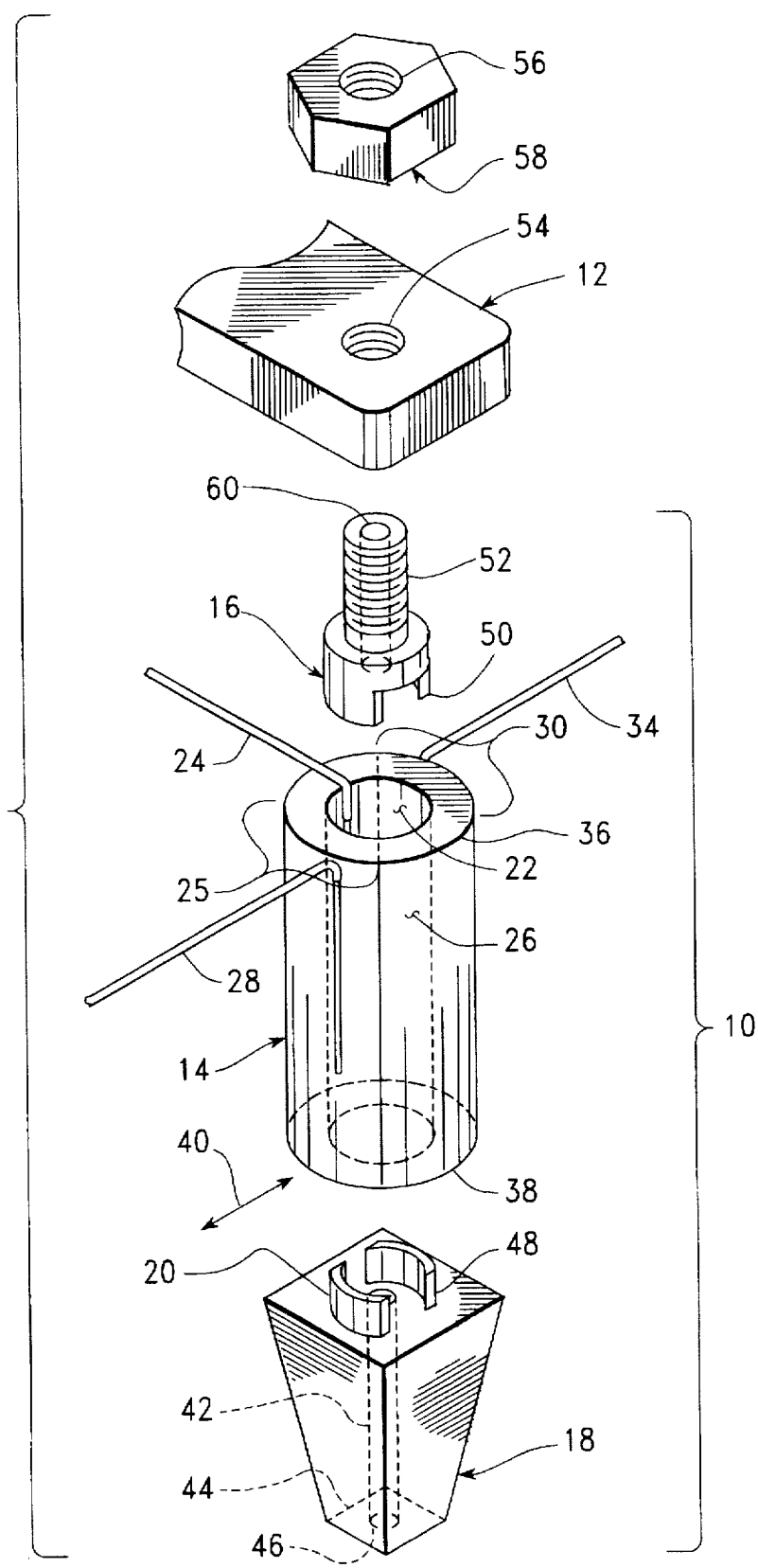
FIG. 1 is an exploded isometric view of an ultrasonic wirebonding assembly built in accordance with the present invention.

FIG. 1 is an exploded isometric view of an ultrasonic wirebonding assembly 10 built in accordance with a first embodiment of this invention, shown with a portion of a carrier 12. This assembly 10 includes a tubular piezoelectric actuator 14, clamped to carrier 12 by means of an upper clamp 16, and a bonding tip 18 clamped to carrier 12 by means of a lower clamp 20.

An inner surface 22 of piezoelectric actuator 14 is coated with a conductive inner coating connected to electrical ground by means of a ground wire 24. A first outer conductive layer 25, formed as a segment extending around a portion of outer surface 26, is connected to a first electrical signal by means of first signal drive wire 28. Similarly, a second outer conductive layer 30, also formed as a segment extending around a portion of outer surface 26, is connected to a second electrical signal by means of a second signal drive wire 34. Outer conductive layers 25 and 30 are on diametrically opposite sides of piezoelectric actuator 14. The remaining portions of outer surface 26 are not covered with a conductive coating.

A first AC signal at the desired ultrasonic frequency, such as 60 kHz, is applied to first signal drive wire 28, while a second AC signal, which is preferably equal to the first AC signal displaced in time by a phase angle of 180 degrees, is applied to second signal drive wire 34. Thus, as a positive voltage is applied to the first outer conductive layer 25, a negative voltage is applied to the second outer conductive layer 30, and vice versa. Due to the piezoelectric properties of the material composing actuator 14, the side of this actuator to which a positive voltage is applied shortens, while the side to which a negative voltage is applied lengthens. With the application of voltage signals in this manner, as the proximal end 36 of actuator 14 is held in place on carrier 12, the distal end 38 thereof vibrates at the frequency of the applied signals on drive wires 28 and 34, in the directions indicated by arrow 40.

Bonding tip 18 has an axial hole 42 through which a bonding wire (not shown) is fed and a clamping surface 44 extending annularly around a distal end 46 of the axial hole 42. Lower clamp 20 is formed as an integral part of bonding tip 18, including a pair of opposing, upward-extending segments 48, which engage a distal portion of inner surface 22 to hold the bonding tip 18 in attachment with distal end 38 of actuator 14. Similarly, upper clamp 16 includes a pair of opposing, descending segments 50, which engage a proximal portion of inner surface 22 to hold the clamp 16 in attachment with proximal end 36 of actuator 14. Preferably, each pair of opposing segments 48, 50 is formed outward to provide an elastic gripping action upon insertion within inner surface 22. Preferably, this gripping action is reinforced by a chemical adhesive extending between the segments 48, 50 and the inner surface 22. Upper clamp 16 also includes a threaded portion 52, which engages threaded hole 54 in carrier 12 and threaded hole 56 in a locknut 58. An axial hole 60 in upper clamp 16 allows a bonding wire (not shown) to be fed therethrough. Thus, the axial hole 60 in upper clamp 16, the inner surface 22 of actuator 14, and the axial hole 42 in bonding tip 18, being coaxially aligned, provide a passageway through which a bonding wire (which will be discussed in reference to FIG. 2) is fed and guided.

Figure 2:
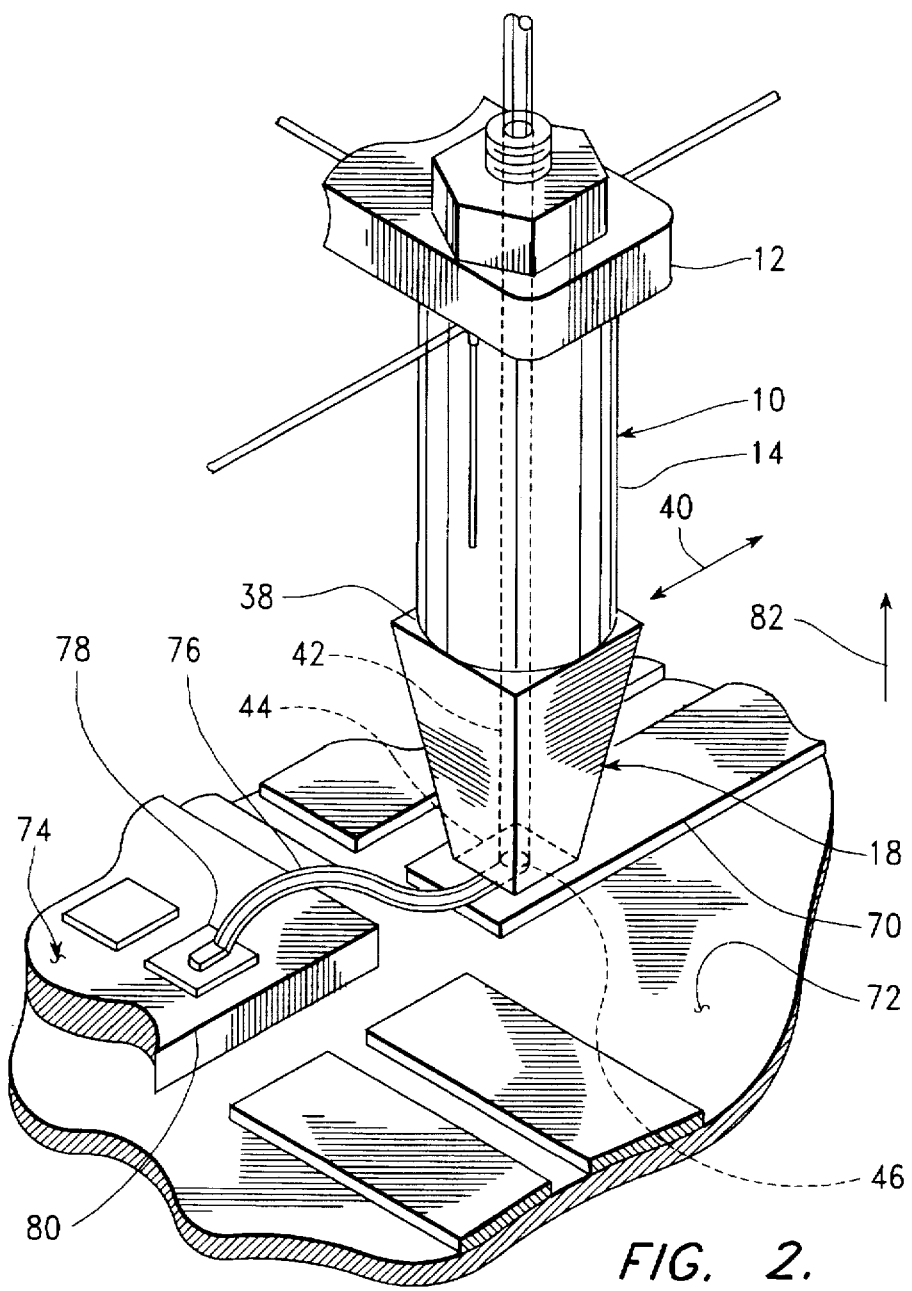
FIG. 2 is an isometric view of the ultrasonic wirebonding assembly of FIG. 1 forming a wirebond on a conductive pad of a semiconductor chip.

FIG. 2 is an isometric view of ultrasonic wirebonding assembly 10 performing a wirebond to a conductive terminal 70 on a substrate 72 of a circuit chip 74. In this example, a first portion of bonding wire 76 extends from a conductive pad 78 of the circuit chip 74, with a wirebond having been made to this pad 78 by means of the wirebonding assembly 10. This configuration is shown for illustrative purposes. Conductive pad 78 and conductive terminal 70 may be at different levels, as shown, in the vertical direction indicated by arrow 82, or they may be at the same level. Conductive terminals, such as terminal 78, may be mounted on a substrate, as shown, or may be held in frame (not shown). Heat may be applied to all or part of the circuit chip 74 and/or to the bonding wire 76 to facilitate a process know as thermosonic wirebonding, increasing the speed at which wirebonded connections are made.

The ultrasonic wirebonding assembly 10 is moved among the various points, such as conductive terminal 70 and conductive pad 78, at which connections are to be made, by means of the movement of carrier 12. During such movement, wirebonding assembly 10 is held upward, in the direction of arrow 82, with bonding tip 18 out of contact with the various structures of circuit chip 74, by means of carrier 12. When a wirebond connection is to be formed, wirebonding assembly 10 is lowered, with a portion of bonding wire 76 extending outward from distal end 46 of axial hole 42 in bonding tip 18, so that this portion of bonding wire 76 is clamped between clamping surface 44 of bonding tip 18 and a surface, such as conductive pad 78, to which a wirebonding attachment is to be made. As bonding wire 76 is held clamped in this way, the piezoelectric actuator 14 is electrically driven, as previously described in reference to FIG. 1, so that the distal end 38 thereof vibrates at an ultrasonic frequency in the directions indicated by arrow 40. Vibrations produced in this way are amplified by the additional length provided by bonding tip 18, and are transferred from clamping surface 48, through the portion of bonding wire 76 clamped thereby, to provide frictional heating at the junction between the bonding wire 76 and the conductive surface to which it is to be bonded. This frictional heat provides the ultrasonic bond.

When this wirebonding process is applied to a segment of bonding wire 76 to be attached between two conductive surfaces, such as conductive pad 78 and conductive terminal 70, after the first wirebonding is performed, the bonding wire 76 is allowed to pull through wirebonding assembly 10. After the second wirebond, a short length of bonding wire 76 is allowed to pull through wirebonding assembly 10 as the wirebonding assembly is moved away from the point at which wirebonding has occurred. Then, as the motion of the wirebonding assembly 10 continues, the bonding wire is clamped, by means which will be described in reference to FIG. 4, so that the wire is broken near the wirebond, leaving a short length of bonding wire extending from the distal end 46 of hole 42, as needed to facilitate the next wirebonding operation. Additional movements of apparatus 10 and additional wirebonding operations are included in this sequence if a single wire segment is to be attached among three or more conductive surfaces.

Figure 3:
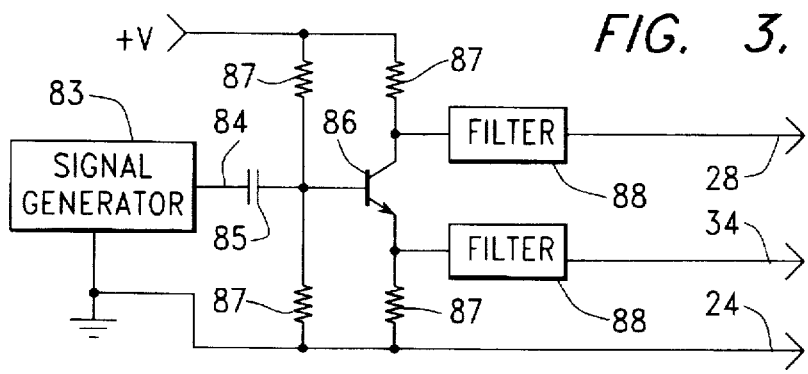
FIG. 3 is a schematic view of an electronic circuit used to drive an actuator in the ultrasonic wirebonding assembly of FIG. 1.

FIG. 3 is a schematic view of the electronic circuit used to generate the signals used to drive the piezoelectric actuator 14 (shown in FIG. 1). A signal generator 83 provides a oscillatory output signal, at the frequency chosen for driving the actuator 14, on line 84, which is coupled through a capacitor 85 to a unity-gain phase splitter including a transistor 86 and four resistors 87. As described in *The Art of Electronics*, by P. Horowitz and W. Hill, Cambridge University Press, 1989, page 77, the voltage V and the resistance values of the resistors 87 are set so that the quiescent collector voltage of transistor 86 is 0.75 Vcc. During operation of this circuit, the collector of transistor 86 can swing from 0.5 Vcc to Vcc, while the emitter can swing from ground to 0.5 Vcc. Filters 88 remove the steady-state effects of this transistor biasing, providing output signals on the lines 28 and 34 used to drive the outer conductive surfaces 25 and 36 of piezoelectric actuator 14 (all shown in FIG. 1), respectively. The inner conductive surface 22 (also shown in FIG. 1) of the actuator 14 is connected to electrical ground through line 24.

Figure 4:
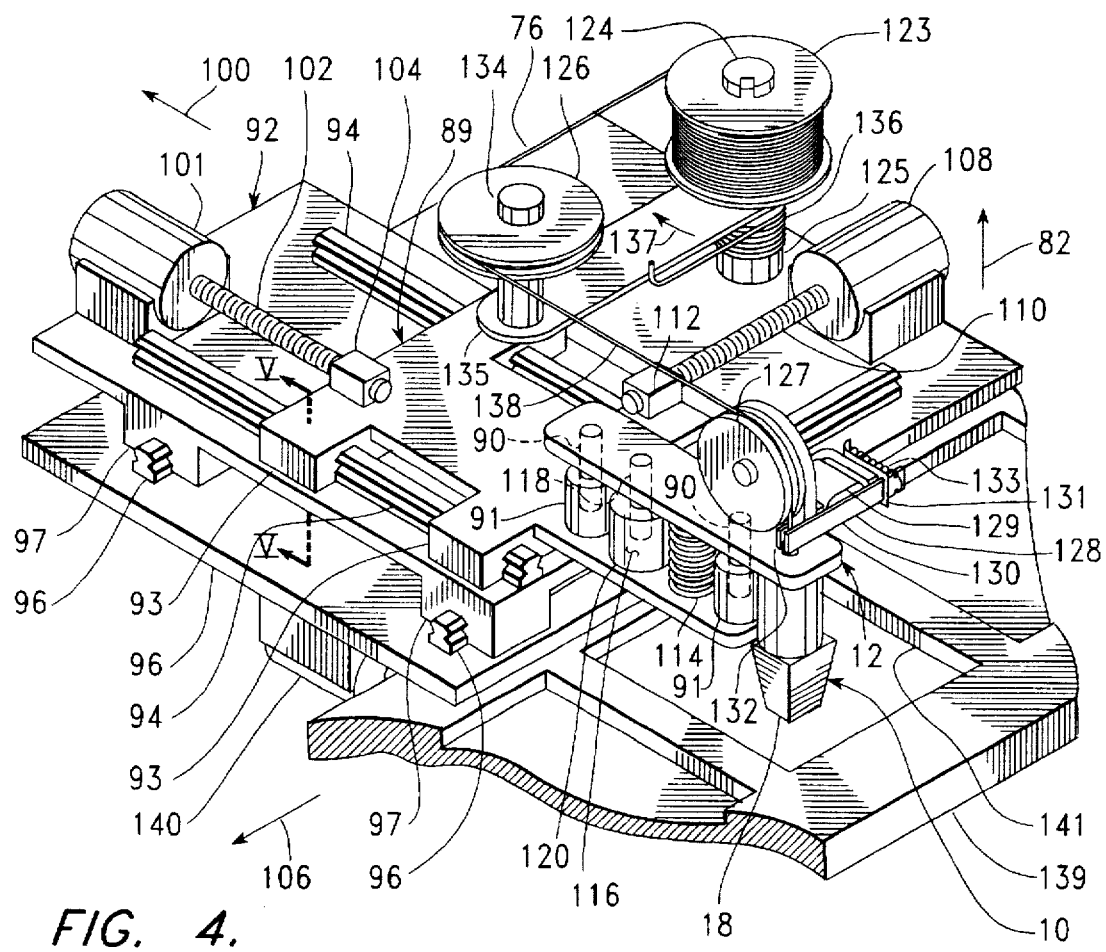
FIG. 4 is an isometric view of apparatus used to move the actuator of the ultrasonic wirebonding assembly of FIG. 1 among points at which wirebonding is required and to provide an engagement force needed for the wirebonding operation.

FIG. 4 is an isometric view of the apparatus used to move wirebonding assembly 10 among the various points in which wirebonding is required and to provide the pressure required for wirebonding operations. The ultrasonic wirebonding assembly 10 is mounted to a carrier 12, which is in turn slidably mounted on an first carriage 89 by means of a pair of shafts 90, extending downward from carrier 12, sliding within a pair of bearings 91, extending upward from first carriage 89. This first carriage 89 is slideably mounted on a second carriage 92 by means of four bearing assemblies 93 movable along two rails 94. Second carriage 92 is in turn slideably mounted on a stationary plate 96 by means of four bearing assemblies 97 movable along two rails 98. First carriage motion, occurring in and opposite the direction indicated by arrow 100, is provided by the operation of first carriage drive motor 101, which rotationally drives a first leadscrew 102. First carriage drive motor 101 is mounted on second carriage 92, while first leadscrew 102 engages an internally-threaded drive block 104 forming a part of first carriage 89. Second carriage motion, occurring in and opposite the direction indicated by arrow 106, is in turn provided by the operation of second carriage drive motor 108, which rotationally drives a second leadscrew 110. Second carriage drive motor 108 is mounted on stationary plate 96, while second leadscrew 110 engages an internally threaded drive block 112, forming a part of second carriage 92. In this way, the wirebonding assembly 10 is moved along a horizontal plane among the various points at which wirebonding is to occur, with motion of the assembly 10 being the resultant of the motion of first carriage 89 in and opposite the direction of arrow 100 and of the motion of second carriage 92 in and opposite the direction of arrow 106.

Referring again to FIG. 2, as previously described, the wirebonding assembly 10 is raised, in the direction of arrow 82, so that bonding tip 18 physically clears various structures of circuit chip 74 as the assembly 10 is moved among the various points at which wirebonding is to occur. During the process of forming each wirebond, a downward force, opposite the direction of arrow 82, is applied, pressing a portion of bonding wire 76 between the distal surface 44 of bonding tip 18 and a terminal 70 or conductive pad 78.

Referring again to FIG. 4, wirebonding assembly 10 is held upward, in the direction of arrow 82, by a compression spring 114 extending between first carriage 89 and carrier 12. The wirebonding operations are carried out with solenoid 116 energized to establish a downward force appropriate for the wirebonding process, through the downward attraction of a solenoid plunger 118, extending downward from carrier 12, by the magnetic field established as current is driven through a solenoid coil 120. Variations in the current applied to the solenoid coil 120 may be used to effect variations in the downward force developed by the apparatus. Such variations are used, for example, to facilitate the use of different types of bonding wire 76.

Referring again to FIG. 2, as previously described, when a section of the bonding wire 76 is to be connected between two points, this wire is supplied to pull downward and outward through axial hole 42 after the first wirebonding operation, as the wirebonding assembly 10 is moved between the points. When wirebonding has been completed at the last point of an electrical connection, the bonding wire 76 is broken by moving wirebonding assembly 10 while preventing the further supply of bonding wire.

Thus, referring again to FIG. 4, bonding wire 76 is supplied from a spool 123 turning with a spindle 124 extending upward from a support shaft 125. A friction brake (not shown) applies a retarding torque to spindle 124 to retard the motion of spool 123, which is keyed to spindle 124. The bonding wire 76 is directed around a portion of a freely-turning pulleys 126 and 127, to extend downward through a clamping mechanism 128 and through holes 60, 22, and 42 (all shown in FIG. 1). The clamping mechanism 128 consists of an electrically operated magnet coil 129, which pulls an armature 130 pivoted at a plate 131 to clamp the wire 76 against an anvil 132. When electrical current is not flowing through coil 129, an extension spring 133 holds armature 130 away from the bonding wire 76, which is allowed to move freely. First freely-turning pulley 126 rotates on an upward-extending pin 134, which is mounted at an end of an arm 135. Arm 135 is in turn pivotally mounted to swing through a predetermined angle on support shaft 125. A torsion spring 136 provides a torque pivoting arm 135 in the direction of arrow 137, maintaining a tension force within bonding wire 76.

When the bonding wire 76 is to be fed with the movement of wirebonding assembly 10 between points, magnet coil 129 is not activated, so that bonding wire 76 is fed downward through bonding tip 18. When the bonding wire is to be broken, magnet coil 129 is activated, so that bonding wire 76 is not fed through bonding tip 18 while the wirebonding assembly 10 is moved between points. In either case, the movement of the wirebonding assembly can move the portion 138 of wire 76 extending between pulleys 127 and 126 in or opposite to the direction of arrow 100. When this portion 138 of wire 76 is moved in the direction of arrow 100, arm 135 pivots in the direction of arrow 137, being pushed by torsion spring 136, so that tension is maintained in the bonding wire 76. When this portion 138 of wire 76 is moved opposite the direction of arrow 100, arm 135 pivots the direction opposite arrow 137 until a stop (not shown) is encountered, limiting arm motion opposite the direction of arrow 137. After this stop is encountered, additional movement of this portion 138 of bonding wire 76 causes bonding wire 76 to be pulled from spool 123, with rotation of the spool. The torsion spring 136 is configured to be weaker in its effect on bonding wire 76 than the friction brake (not shown) retarding the motion of spindle 124 and spool 123, so that movement of the arm 135 opposite the direction of arrow 137 is completed before bonding wire 76 is pulled from the spool 123.

The maximum anticipated movement of portion 138 of bonding wire 76 in the direction of arrow 100 occurs as bonding tip 18 is moved between the extremes of its movement in the direction of arrow 100 with clamping mechanism 128 holding the wire 78. Whether this movement of portion 138 of wire 76 occurs with a single movement of the bonding tip 18 or with a combination of several such movements, the available movement of arm 76 is sufficient to maintain tension in the bonding wire 76.

An indexing chip carrier 139 is driven in the direction of arrow 106 in an intermittent fashion by chip carrier drive motor 140. The chip carrier 139 includes a number of slots 141, in which circuit chips, such as circuit chip 74 of FIG. 2, are loaded for wirebonding. Each slot 141 is configured to hold a circuit chip tightly, with alternate means (not shown), such as dowel pins, clamps, or springs, specific to the type of circuit chip, being provided to hold the chip accurately in position on the chip carrier 139. The movement of chip carrier 139 is controlled so that each individual circuit chip remains in position for wirebonding with the apparatus 10 during the wirebonding operations, with an adjacent circuit chip subsequently being moved into this position by an indexing movement of the carrier 139.

Thus, a significant advantage over wirebonding apparatus of the prior art is achieved by providing movement of the wirebonding apparatus of the present invention among the various points on a single circuit chip at which wirebonding is to occur. An independent, indexing movement is used to supply individual circuit chips to the wirebonding process. Unlike the prior art processes, except to supply different, individual chips for wirebonding, the chips are not moved. In this way, the movement of chips is made convenient for the manufacturing process. For example, batch loading and unloading may be used, with the chip carrier 139 being loaded with a number of circuit chips to begin the process, and with the same number of circuit chips being unloaded following completion of the process. Alternately, chip carrier 139 may be loaded with individual chips from a conveying system.

Figure 5:
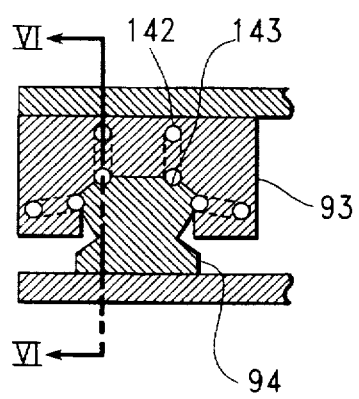
FIG. 5 is a vertical cross-sectional elevation of a rail and bearing assembly in the apparatus of FIG. 4, taken as indicated by section lines V—V in FIG. 4.
Figure 6:
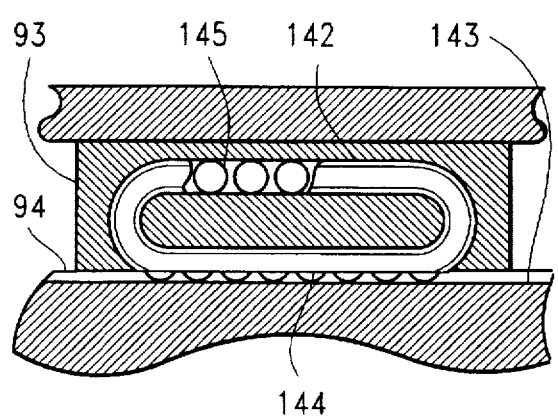
FIG. 6 is a vertical cross-sectional elevation of the rail and bearing assembly of FIG. 5, taken as indicated by section lines VI—VI in FIG. 5.

FIGS. 5 and 6 are vertical cross-sectional elevations of bearing block 92 and rail 94, with FIG. 5 being taken as indicated by cross-section lines V—V in FIG. 4, and with FIG. 6 being taken as indicated by cross-section lines VI—VI in FIG. 5. Bearing block 93 includes four ball raceways 142, while rail 94 includes four corresponding, longitudinally-extending grooves 143. Each raceway 142 is formed, for example, using an oval-shaped tube having an opening 144 allowing a number of bearing balls 145 to roll against an adjacent groove 143. The raceways 142 are arranged so that the various reaction forces arising from operation of the apparatus are resolved into contact forces between bearing balls 145 and grooves 144.

Figure 7:
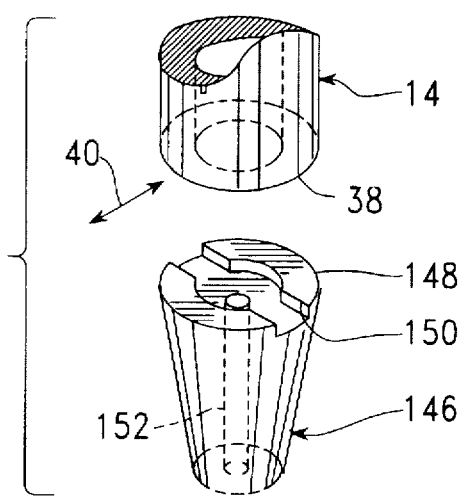
FIG. 7 is an isometric view of a first alternative bonding tip for the ultrasonic wirebonding assembly of FIG. 1, shown in an exploded relationship with an actuator thereof.

FIG. 7 is an isometric view of a first alternative bonding tip 146, shown in an exploded relationship with the piezoelectric actuator 14, to which it is attached. The surface of proximal end 148 of bonding tip 146 fits against the surface of distal end 38 of actuator 14, being adhesively cemented thereto, so that a bond is formed without the upward-extending segments 48 of bonding tip 18 (shown in FIG. 1). A slot 150, extending perpendicularly to the directions of vibration, as indicated by arrow 40, of the distal end 38 of actuator 14, interrupts the surface of proximal end 148 of bonding tip 146, allowing for the warping of distal end 38 of actuator 14 with ultrasonic vibrations. The general shape of bonding tip 146 is that of a truncated cone, whereas the general shape of bonding tip 18 (shown in FIG. 1) is that of a truncated pyramid. An axial hole 152 extends through bonding tip 146, allowing the passage of bonding wire 76 (shown in FIG. 2) therethrough.

Figure 8:
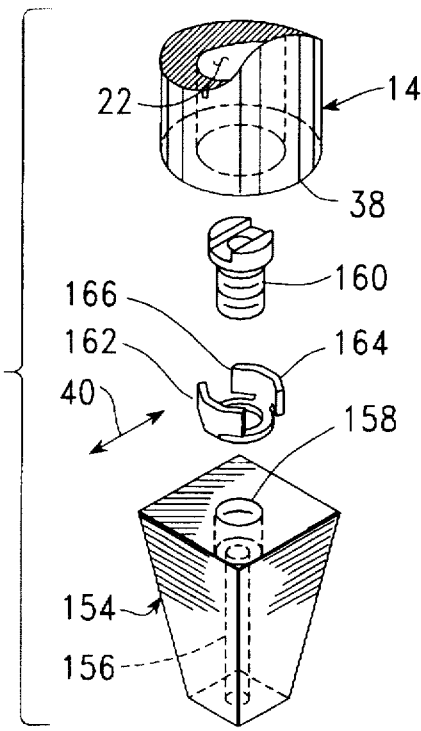
FIG. 8 is an isometric view of a second alternative bonding tip for the ultrasonic wirebonding assembly of FIG. 1, shown in an exploded relationship with an actuator thereof.

FIG. 8 is an isometric view of a second alternative bonding tip 154, also shown in an exploded relationship with the piezoelectric actuator 14, to which it is attached. Axial hole 156 includes a counterbored and threaded upper portion 158, engaging a screw 160, which holds a formed clamp 162 in place. Upstanding curved tabs 164 of clamp 162 engage a distal portion of the inner surface 22 of actuator 14, being preferably also cemented thereto. Again, a slot 166 is provided, extending between tabs 164 in a direction perpendicular to the directions of vibration indicated by arrow 40.

Figure 9:
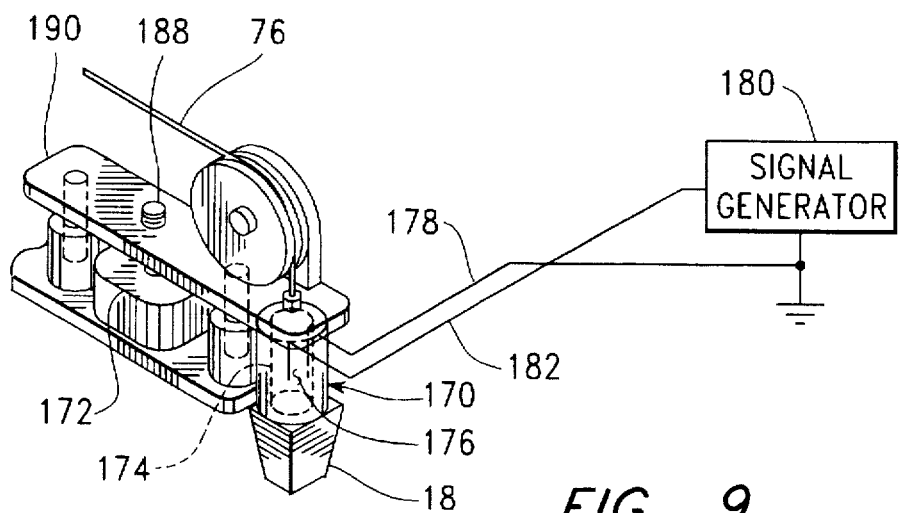
FIG. 9 is an isometric view of an alternative actuator for the ultrasonic wirebonding assembly of FIG. 1, shown with an alternative mechanism for providing the clamping force needed for the wirebonding operation.

FIG. 9 is a partial isometric view of an alternative embodiment of the present invention, including an alternative ultrasonic actuator 170 and an engagement drive motor 172. This alternative actuator 170 is a piezoelectric tube having an internal conductive surface 174 and an outer conductive surface 176. The inner conductive surface 174 is connected to electrical ground by an actuator grounding wire 178, and the outer conductive surface 176 is connected to the output of a signal generator 180 by actuator driving wire 182. With this configuration, the application of a negative voltage to the outer conductive surface 176 increases the length of actuator 170, moving a bonding tip 18 attached to the distal end thereof in the engagement direction of arrow 184. The application of a positive voltage to the outer conductive surface 176 decreases the length of actuator 170. When the output of signal generator 180, consisting of voltage fluctuations at the desired ultrasonic frequency, is applied to the outer conductive surface 176, bonding tip 18 vibrates at this frequency in and opposite to the direction indicated by arrow 184.

Bonding wire 76 is fed through the actuator 170 and the bonding tip 18, and the ultrasonic bonding apparatus of FIG. 9 is moved among the various points at which ultrasonic bonds are to be made, generally as previously discussed in reference to FIGS. 2 and 4. However, while the apparatus of FIG. 2 relies on a substantially constant force loading, achieved using a solenoid, the proximal end of alternative actuator must be clamped, preventing movement in and opposite the engagement direction of arrow 184. This type of clamping is necessary to allow the generation of bonding tip motion occurring at an ultrasonic frequency in and opposite the direction of arrow 184. Thus, an engagement drive motor 186, turning an engagement drive leadscrew 188, engaging a threaded hole within a carrier 190, to which the alternative actuator 170 is attached, is used to drive the actuator 170 in and opposite to the direction of arrow 184. Other details of the apparatus partly shown in FIG. 9, and of the operation thereof, are as previously described in reference to FIGS. 1–6.

Figure 10:
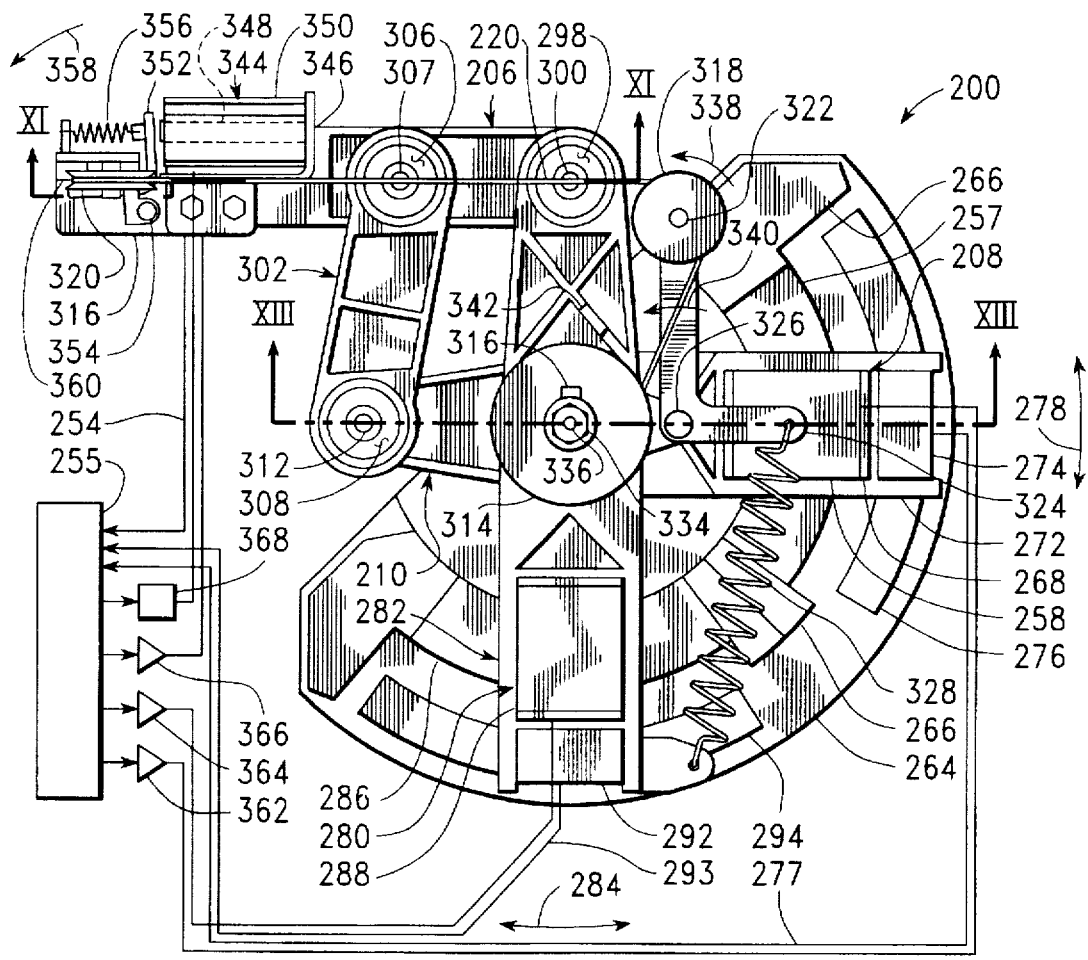
FIG. 10 is a plan view of alternative apparatus used to move a wirebonding assembly including the ultrasonic actuator of FIG. 1 or of FIG. 9 among points at which wirebonding is required and to provide a clamping force needed for the wirebonding operation.
Figure 11:
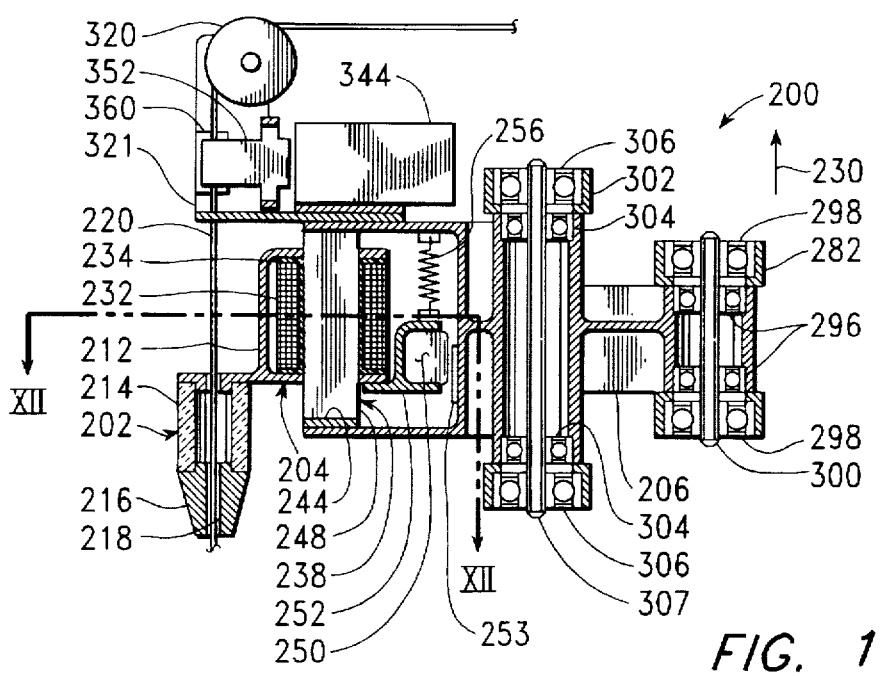
FIG. 11 is a partial vertical cross-sectional view of the alternative apparatus of FIG. 10, taken as indicated by section lines XI—XI in FIG. 10 to show linkage pivots and the mechanism used to move a bonding tip into engagement with a workpiece.
Figure 12:
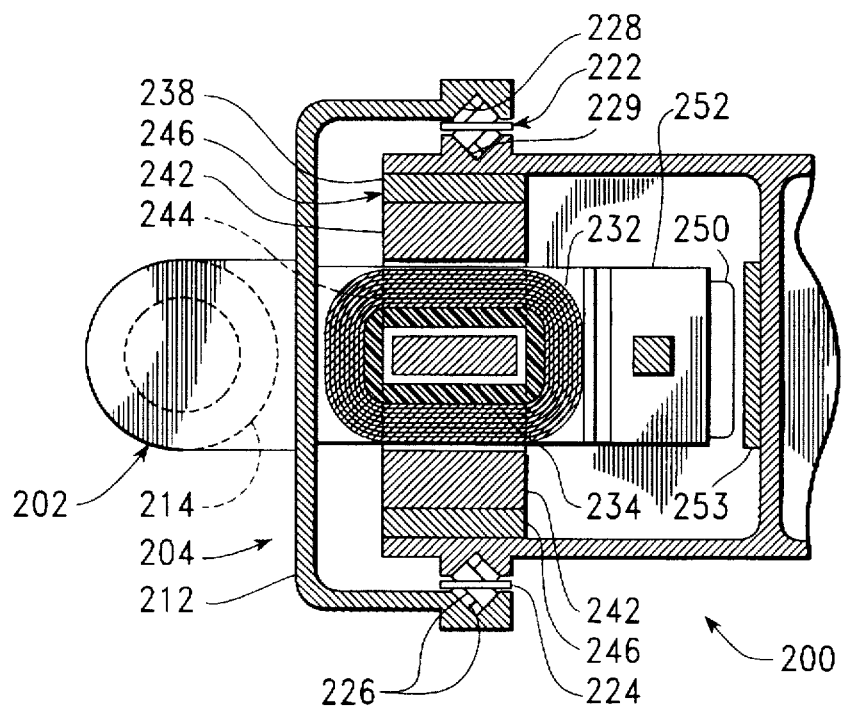
FIG. 12 is a partial horizontal cross-sectional view of the alternative apparatus of FIG. 10, taken as indicated by section lines XII—XII in FIG. 11 to show a linear motor used to move the bonding tip into engagement with the workpiece.
Figure 13:
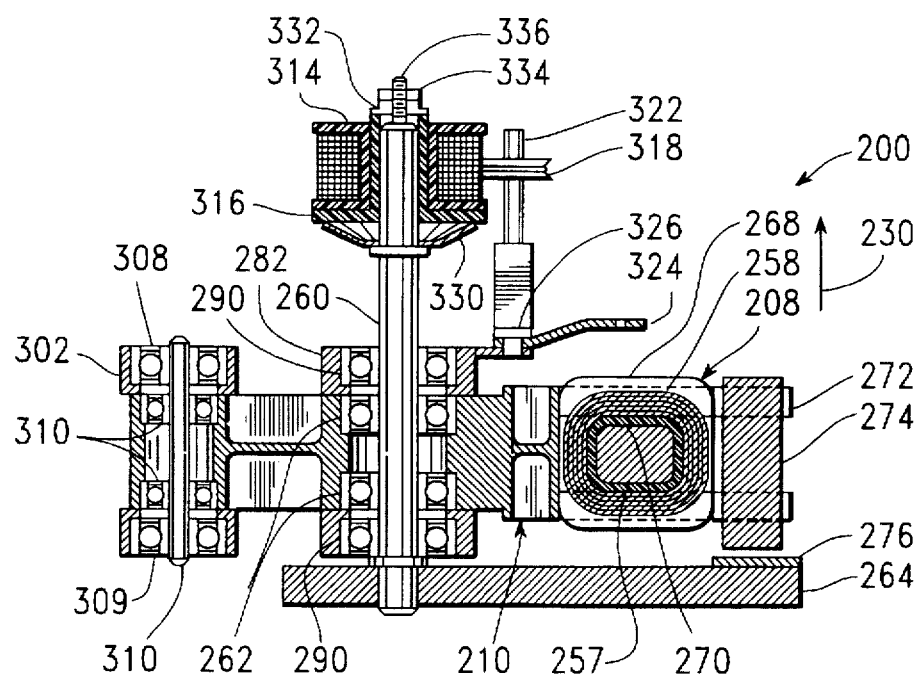
FIG. 13 is a partial vertical cross-sectional view of the alternative apparatus of FIG. 10, taken as indicated by section lines XIII—XIII in FIG. 10 to show linkage pivots and one of two similar motors used to move the wirebonding assembly among points at which wirebonding is required.

FIGS. 10–13 show an alternative drive mechanism 200, with FIG. 10 being a plan view thereof. FIG. 11 is a cross-sectional elevation, taken as indicated by section lines XI—XI in FIG. 10 to show a wirebonding assembly 202 and a linear motor 204 used to move the apparatus 202 in a vertical direction, and a drive link 206 mounting the motor 204. FIG. 12 is a partial cross-sectional plan view taken as indicated by section lines XII—XII in FIG. 11 to show the linear motor 204. FIG. 13 is a cross-sectional elevation, taken as indicated by section lines XIII—XIII in FIG. 10 to show an arcuate motor 208 used to move the wirebonding assembly 202 in a horizontal plane by means of a first drive arm 210.

Referring first to FIGS. 11 and 12, wirebonding assembly 202 is attached to a slider 212 forming an output portion of linear motor 204. Wirebonding assembly 202 includes a piezoelectric tube actuator 214, which may produce either ultrasonic vibrations along a horizontal line (parallel to the surface of the pad to which a wire is bonded), as described above in reference to FIGS. 1–3, or along a vertical line (perpendicular to the surface of the pad to which a wire is bonded), as described above in reference to FIG. 9. Wirebonding assembly 202 also includes a wirebonding tip 216 having an axial hole 218 through which a bonding wire 220 is fed. The slider 212 is in turn slidably mounted on drive link 206 by means of a pair of crossed roller assemblies 222. Each crossed roller assembly 222 includes a retainer 224 rotatably mounting a number of rollers 226, which roll along the opposing surfaces of inward-facing V-shaped grooves 228 in slider 212 and outward-facing V-shaped grooves 229 in drive link 206. In this way slider 121 is slidably mounted to move vertically, in the upward direction of arrow 230 and opposite thereto.

Linear motor 204 also includes a coil 232 formed over a bobbin 234 so that individual turns of the coil are wound around a central aperture 236 of the bobbin 234. The coil 232 is mounted to move with slider 212, so that motions of the coil 232 are transmitted through the slider 212 to wirebonding apparatus 202. The stationary portion of linear motor 204 includes a frame 238, which is composed of a magnetic material such as electrical iron, and a pair of permanent magnets 242. Frame 238 includes a lower portion 244, extending transversely between a pair of upstanding end legs 246, and an upstanding central leg 248. The permanent magnets 242 are attached to extend inward from end legs 246, with each magnet 242 having a similar pole (such as a north pole) facing inward, toward coil 232, while the opposite pole faces outward, toward the surface of the adjacent end leg 246. The central leg 248 extends upward through the aperture 236 in bobbin 234. With this arrangement, when an electrical current is driven through coil 232, a force is established in the coil to move slider 212 upward, in the direction of arrow 230, or downward, opposite thereto. The force is proportional to the current flowing through the coil 232, and its direction is determined by the direction of current flow.

Continuing to refer to FIGS. 11 and 12, and referring additionally to FIG. 10, an optical sensor 250 is also fastened to slider 212, by means of a sensor bracket 252. This sensor 250 moves, with the slider 212, adjacent an optical scale 253, which is fastened to drive link 206. Data provided as an output of sensor 250 is fed along a line 254 to a port of a computing system 255, which uses an algorithm to determine the actual position of slider 212 in the vertical direction indicated by arrow 230.

An extension spring 256, extending between drive link 206 and sensor bracket 252 provides an upward force on slider 212 to ensure that the slider, and all the elements attached thereto, are held upward when no current is applied to flow through coil 232.

Referring to FIGS. 10 and 13, one of the devices moving wirebonding assembly 202 (shown in FIG. 11) in a horizontal plane (i.e. perpendicular to the direction of arrow 230) is first arcuate motor 208, which includes a stationary permanent magnet 257 and a coil 258 moving along an arcuate path with first drive arm 210, which is pivotally mounted on a stationary shaft 260 by means of a pair of bearings 262. Shaft 260 is rigidly attached to a base plate 264. Permanent magnet 257 is attached by means of a pair of mounting blocks 266 to extend above base plate 264 in a spaced-apart relationship therewith. The permanent magnet 257 is magnetized to have a single pole (such as a north pole) extending along its upper surface and the opposite pole extending along its lower surface. The coil 258 is wound over a bobbin 268, including a central aperture 270, through which permanent magnet 257 extends.

Bobbin 258 is held in place on first drive arm 210 within four outward extending posts 272 forming part of the arm 210. With this arrangement, when an electrical current is driven through coil 258, a force is established within the coil 258 to move the drive arm 10 rotationally about stationary shaft 260. This force, and hence the torque acting on first drive arm 210 from the coil 258, is proportional to the current flowing through coil 258, and the direction of this force is determined by the direction of current flow within coil 258.

An optical sensor 274 is also fastened to first drive arm 210, being directed at an arcuate optical scale 276 extending along base plate 264. Data provided as an output of sensor 274 is fed along a line 277 to an input port of the computing system 255 which uses an algorithm to determine the actual position of first drive arm 210 in the directions indicated by arrow 278.

The other device moving wirebonding assembly 202 (shown in FIG. 11) in a horizontal plane is a second arcuate motor 280 driving a second drive arm 282 in the directions indicated by arrow 284. This motor 280, which includes a permanent magnet 286 and a coil 288, is similar or identical to the previously-described motor 208. The second drive arm 282 is pivotally mounted on stationary shaft 260 by means of a pair of bearings 290. A second optical sensor 292 is mounted on second drive arm 282 to move above a second optical scale 294. Data provided as an output of sensor 292 is also fed along a line 293 to an input port of the computing system 255 which uses an algorithm to determine the actual position of second drive arm 282 in the directions indicated by arrow 284.

Referring to FIGS. 10 and 11, drive link 206 is pivotally mounted on second drive arm 282 by means of bearings 296 in drive link 206, bearings 298 in second drive arm 282, and a shaft 300 extending through the bearings 296, 298. Drive link 206 is also pivotally mounted on a connecting link 302 by means of bearings 304 in drive link 206, bearings 306 in connecting link 302, and a shaft 307 extending through the bearings 304, 306.

Referring again to FIGS. 10 and 13, connecting link 302 is also pivotally mounted on first drive arm 210 by means of bearings 308 in connecting link 302, bearings 310 in first drive arm 210, and a shaft 312 extending through the bearings 308, 310.

Continuing to refer to FIGS. 10 and 13, and referring as well to FIG. 11, bonding wire 220 is supplied to wirebonding assembly 202 from a spool 314 turning with a spindle 316 on stationary shaft 260. This wire 220 is fed over a tensioning pulley 318, and an idler pulley 320, which is rotatably mounted on a bracket 321 extending upward from driving arm 206. Tensioning pulley 318 is rotatably mounted on a pin 322 extending upward from a tensioning crank 324, which is in turn pivotally mounted on second drive arm 282 by means of a rivet 326. An extension spring 328 applies a torque to tensioning crank 324, which in turn applies a force to tensioning pulley 318 to maintain tension in the bonding wire 220 as the wirebonding assembly 202 is moved. The spindle 316 is held downward, against a spring washer 330, by means of a nut 332 and locknut 334, engaging a threaded portion 336 of stationary shaft 260. Spring washer 330, which is centrally attached to stationary shaft 260, applies a retarding torque to the lower surface of spindle 316, so that cable tensioning can be applied through tensioning pulley 318.

Since the tensioning force developed in bonding wire 206 through tensioning pulley 318 is lower than the force required to turn spindle 316 through spool 314, pulling the wire 220 extending partly around pulley 318 in the direction of arrow 338 results in the rotation of tensioning crank 324 in the direction of arrow 340 until the crank 324 rests against a motion stopping tab 342 extending upward from second drive arm 262. After contact occurs between crank 324 and tab 342, continued movement of the bonding wire 220 extending partly around pulley 318 results in additional wire being pulled off spool 314. Movement of the bonding wire 220 extending partly around pulley 318 in the direction opposite arrow 338 results in the movement of tensioning crank 324 opposite the direction of arrow 340, being pulled by extension spring 226 to maintain tension in the bonding wire 220.

Referring again to FIGS. 10 and 11, a clamping mechanism 344, for clamping bonding wire 220 so that it can be broken by movement of bonding assembly 202, as generally described above in reference to FIG. 2, is also attached to drive link 206 by means of bracket 321. The clamping mechanism 344 includes an iron "L"-shaped frame member 346, a cylindrical iron core 348, a coil 350 over the core 348, and an armature 352 pivotally mounted at a pin 354 extending upward from the bracket 321. When electrical current is not flowing through coil 350, an extension spring 356 holds armature 352 pivoted in the direction of arrow 358, out of contact with the bonding wire 220. When electrical current is driven through coil 350, armature 352 is attracted to move in the direction opposite arrow 358, clamping the bonding wire 220 against an anvil surface 360 of bracket 321. The anvil surface 360 may include a groove through which the wire 220 extends.

In operation, the wirebonding assembly 202 is moved generally as described above (for wirebonding assembly 10) with reference to FIG. 2. For each angular position of first drive arm 210, as determined by the output of sensor 274, together with an angular position of second of second drive arm 282, as determined by the output of sensor 292, the wirebonding assembly 202 is placed in at a unique point in a horizontal plane extending perpendicularly to arrow 230. The computing system 255 executes an algorithm determining the position of the wirebonding assembly 202 as a function of the angular positions determined from the outputs of sensors 274 and 292. Computing system 255 also accesses a list of coordinates describing the locations to which wirebonding assembly 202 must be moved in sequence to perform the wirebonding operations desired on a circuit chip, such as circuit chip 74 of FIG. 2, going through the wirebonding process. The algorithm calculates the difference between the actual location of the wirebonding assembly 202 and where it should be to perform the desired wirebonding operations and determines the levels of current to apply to first drive motor 208 and to second drive motor 280 to bring wirebonding assembly 202 into the desired position. These currents are applied through amplifiers 362 and 364, respectively, each of which is connected to an output port of the computing system 255.

When wirebonding assembly 202 is thus positioned as needed for a wirebonding operation, current is driven through coil 232 of linear motor 204 to lower the assembly 202. As the wirebonding operation occurs, a continued flow of current through coil 232 maintains the downward pressure needed for bonding. When an individual wirebonding operation is completed, wirebonding assembly 202 is allowed to rise according to the upward force provided by extension spring 256. Alternately, this spring force may be aided by reversing the direction of current flow through the coil 232. The current used to drive linear motor 204 is supplied as an output of amplifier 366, which is also connected to an output port of computing system 255.

When the bonding wire 220 is to be broken by movement of wirebonding assembly 202, again as described above in reference to FIG. 2, a magnet driver 368 connected to another output port of computing system drives electrical current through coil 350 of clamping mechanism 344, so that bonding wire 220 is clamped against anvil 360 as the wirebonding assembly 202 moves away from the spot at which a wire bond has been made.

While means for holding circuit chips going through the wirebonding process have not been shown in FIGS. 10–13, it is understood that an indexing system, as discussed in reference to FIG. 4, is readily used for the type of wirebonding apparatus shown in FIGS. 10–13, and that the advantages discussed therefor in reference to FIG. 4, apply equally to a system using the mechanisms discussed in reference to FIGS. 10–13.

It is understood that alternative versions of the present invention may be formed using various combinations of the alternatives shown in FIGS. 8–9. The alternative methods for attachment of the distal end 38 of piezoelectric actuator 14, as discussed above in reference to FIGS. 7 and 8, may be employed to fasten the proximal end of the actuator 17 to the carrier 12 (shown in FIG. 4) or to the carrier 190 (shown in FIG. 9).

While the invention has been described in its preferred forms or embodiments with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus for performing wirebonding operations on a circuit chip, wherein said apparatus comprises:

tubular piezoelectric actuator;

mounting means for mounting said actuator from a proximal end thereof to extend in an engagement direction;

a bonding tip attached to a distal end of said actuator, extending in said engagement direction therefrom;

a passageway, formed by internal surfaces of said mounting means, said actuator, and said bonding tip, to extend therethrough, for supplying bonding wire therethrough; and actuator drive means for applying an electrical signal at an ultrasonic frequency to said actuator to cause said distal end of said actuator to vibrate at an ultrasonic frequency.

2. The apparatus of claim 1, comprising additionally:

engagement drive means for moving said mounting means in and opposite to said engagement direction; and positioning drive means for moving said mounting means perpendicularly to said engagement direction.

3. The apparatus of claim 2:

wherein said positioning drive means includes first and second carriages, first drive means for moving said first carriage in and opposite to a first direction relative to said second carriage, and second drive means for moving said second carriage in and opposite to a second direction, with said first carriage being slideably mounted on said second carriage to move in said first direction relative to said second carriage, said first direction being perpendicular to said engagement direction, and with said second carriage being slideably mounted on a stationary plate to move in said second direction, said second direction being perpendicular to said engagement direction and to said first direction; and wherein said engagement drive means includes a carrier to which said mounting means is attached, said carrier being slideably mounted on said first carriage to move in and opposite said engagement direction, and engagement actuation means moving said carrier in and opposite to said engagement direction.

4. The apparatus of claim 3:

wherein said first drive means includes a first drive motor mounted on said second carriage and a first leadscrew turned by said first drive motor, with said first leadscrew engaging a threaded portion of said first carriage; and wherein said second drive means includes a second drive motor mounted on said stationary plate and a second leadscrew turned by said second drive motor, with said second leadscrew engaging a threaded portion of said second carriage.

5. The apparatus of claim 3, wherein said engagement actuation means includes a solenoid moving said carrier in a direction opposite said engagement direction, and a spring extending between said first carriage and said carrier.

6. The apparatus of claim 3, wherein said engagement actuation means includes an engagement drive motor mounted on said first carriage and an engagement leadscrew engaging a threaded portion of said carrier.

7. The apparatus of claim 2, additionally comprising conveying means moving said circuit chip into a workspace, holding said circuit chip within said workplace as said wirebonding operations are performed, and removing said circuit chip from said workspace, wherein said bonding tip is moved adjacent said workspace by said positioning drive means.

8. The apparatus of claim 7, wherein said conveying means includes:

a circuit chip conveyance holding a plurality of circuit chips in an aligned, spaced-apart relationship; and circuit chip indexing means moving said circuit chip conveyance so that individual circuit chips are sequentially moved into said workspace, held therein, and moved therefrom.

9. The apparatus of claim 1, wherein said actuator drive means includes:

a conductive inner coating extending around an inner surface of said actuator, from said proximal end thereof to said distal end thereof;

a first conductive outer coating extending around a first segment of an outer surface of said actuator, from said proximal end thereof to said distal end thereof;

a second conductive outer coating extending around a second segment of said outer surface, from said proximal end of sand actuator to said distal end thereof, said second conductive outer coating being diametrically opposite said first conductive outer coating on said actuator;

grounding means connecting electrical ground to said conductive inner coating;

first signal drive means applying said electrical drive signal to said first conductive coating; and second signal drive means applying an inverted electrical drive signal to said second conductive coating, with said second inverted electrical drive signal being essentially equivalent to said electrical drive signal with a 180-degree phase shift.

10. The apparatus of claim 9, comprising additionally:

conveying means moving said circuit chip into a workspace, holding said circuit chip within said workspace, and removing said circuit chip from said workspace, wherein said circuit chip within said workspace is exposed to said bonding tip;

engagement means moving said bonding tip into said workspace in said engagement direction with a predetermined force;

disengagement means moving said bonding tip from said workplace in a direction opposite said engagement direction;

positioning drive means for moving said bonding tip perpendicularly to said engagement direction and adjacent to said workspace.

11. The apparatus of claim 1, wherein said actuator drive means includes:

a conductive inner coating extending around an inner surface of said actuator, from said proximal end thereof to said distal end thereof;

a conductive outer coating extending around an outer surface of said actuator, from said proximal end thereof to said distal end thereof, wherein said actuator drive means applies said electrical signal to said conductive outer coating; and grounding means connecting electrical ground to said conductive inner coating.

12. The apparatus of claim 11, additionally comprising:

conveying means moving said circuit chip into a workspace, holding said circuit chip within said workspace, and removing said circuit chip from said workspace, wherein said circuit chip within said workspace is exposed to said bonding tip;

an engagement drive moving said bonding tip into said workspace in said engagement direction, holding said bonding tip within said workspace, and removing said bonding tip from said workspace in a direction opposite said engagement direction;

positioning drive means for moving said bonding tip perpendicularly to said engagement direction and adjacent to said workspace.

13. The apparatus of claim 12, wherein said engagement drive includes and engagement drive motor and a leadscrew.

14. Apparatus for performing wirebonding operations on a circuit chip, wherein said apparatus comprises:

conveyance means moving said circuit chip into a workspace, holding said circuit chip within said workspace, and removing said circuit chip from said workspace;

an ultrasonic wirebonding assembly having a bonding tip with an axial bonding tip hole extending therethrough, moved into said workspace in an engagement direction, and a piezoelectric actuator attached to said bonding tip, with said piezoelectric actuator being electrically driven to vibrate said bonding tip at an ultrasonic frequency, wherein said wirebonding assembly is moved perpendicular to said engagement direction among positions where wirebonding connections are made as said circuit chip is held within said workspace, wherein said piezoelectric actuator occupies an annular space around a cylindrical opening therein, and wherein said piezoelectric actuator is fastened to a movable carrier by means of a mounting structure including an axial mounting structure hole; and wire supply means for supplying bonding wire through said axial bonding tip hole into said workspace, wherein said axial bonding tip hole, said cylindrical opening in said piezoelectric actuator, and said axial mounting hole are coaxially aligned to provide a passageway through which said bonding wire is supplied into said workspace.

15. The apparatus of claim 14, wherein said piezoelectric actuator includes:

an inner conductive coating extending around said cylindrical opening therein, with said inner conductive coating being connected to electrical ground;

a first outer conductive coating extending around a first sector of an outer surface of said piezoelectric actuator, with said first outer conductive coating being connected to a first electrical driving signal at said ultrasonic frequency;

a second outer conductive coating extending around a second sector of said outer surface, with said second outer conductive coating being connected to a second electrical driving signal, with said first and second electrical driving signals being similar in frequency and amplitude, and with said first and second electrical driving signals being separated in time by a phase angle of 180 degrees.

16. The apparatus of claim 15:

wherein said movable carrier is slideably mounted to move on a first carriage in said engagement direction and opposite thereto, being moved opposite said engagement direction by operation of a solenoid;

wherein said first carriage is slideably mounted to move in a first direction and opposite thereto on a second carriage, being moved by a first carriage drive motor through rotation of a first carriage drive leadscrew; and wherein said second carriage is slideably mounted to move in a second direction and opposite thereto on a stationary plate, being moved by a second carriage drive through rotation of a second carriage drive leadscrew.

17. The apparatus of claim 14, wherein said piezoelectric actuator includes:

an inner conductive coating extending around said cylindrical opening therein, with said inner conductive coating being connected to electrical ground;

an outer conductive coating extending around an outer surface of said piezoelectric actuator, with said first outer conductive coating being connected to an electrical driving signal at said ultrasonic frequency.

18. The apparatus of claim 17:

wherein said movable carrier is slideably mounted to move on a first carriage in said engagement direction and opposite thereto, being moved by an engagement drive motor through rotation of an engagement leadscrew;

wherein said first carriage is slideably mounted to move in a first direction and opposite thereto on a second carriage, being moved by a first carriage drive motor through rotation of a first carriage drive leadscrew; and wherein said second carriage is slideably mounted to move in a second direction and opposite thereto on a stationary plate, being moved by a second carriage drive through rotation of a second carriage drive leadscrew.

19. The apparatus of claim 14, wherein said conveyance means includes:

a circuit chip conveyance holding a plurality of circuit chips in an aligned, spaced-apart relationship; and circuit chip indexing means moving said circuit chip conveyance so that individual circuit chips are sequentially moved into said workspace, held therein, and moved therefrom.

* * * * *